United States Patent [19]

Greschner et al.

[11] 4,393,127
[45] Jul. 12, 1983

[54] STRUCTURE WITH A SILICON BODY HAVING THROUGH OPENINGS

[75] Inventors: Johann Greschner, Pliezhausen; Georg Kraus, Wildberg; Gerhard E. Schmid, Leinfelden-Echterdingen, all of Fed. Rep. of Germany

[73] Assignee: International Business Machines Corporation, Armonk, N.Y.

[21] Appl. No.: 284,268

[22] Filed: Jul. 17, 1981

[30] Foreign Application Priority Data

Sep. 19, 1980 [EP] European Pat. Off. ........ 80105618.5

[51] Int. Cl.³ .......................................... H01L 21/306
[52] U.S. Cl. ..................................... 430/5; 250/503.1;
250/505.1; 428/138; 428/466; 430/644;
430/966; 430/967; 378/161
[58] Field of Search ............................ 430/5, 966, 967;
526/644, 659.1; 428/138, 466; 250/503, 505

[56] References Cited

U.S. PATENT DOCUMENTS

| | | |
|---|---|---|
| 3,713,922 | 1/1973 | Lepselter et al. ................... 156/644 |
| 3,794,510 | 2/1974 | Scala et al. .............................. 430/5 |
| 4,059,480 | 11/1977 | Ruh et al. ............................ 430/967 |
| 4,092,211 | 5/1978 | Morris ................................ 156/644 |
| 4,152,601 | 5/1979 | Kadota et al. ....................... 250/505 |
| 4,198,263 | 4/1980 | Matsuda ................................. 430/5 |
| 4,269,654 | 5/1981 | Decker et al. .................... 156/159.1 |
| 4,324,611 | 4/1982 | Vogel et al. ...................... 156/159.1 |

*Primary Examiner*—Jack P. Brammer
*Attorney, Agent, or Firm*—Yen S. Yee

[57] ABSTRACT

A structure for shaping or masking energetic radiation is described. The structure comprises a shallow silicon body having at least one through opening, and a metal silicide layer covering the surface of the structure. The structure characterized by having a high mechanical, and thermal stability may be used particularly in electron and X-ray lithography. More specifically, the structure may be used as an aperture for electron beams, or as a mask for X-rays. The production of the structure includes the steps of making through openings in the silicon body, and the forming of the silicide layer by vapor depositing a metal on the surface of the silicon body and by subsequent annealing.

13 Claims, 17 Drawing Figures

STRUCTURE WITH A SILICON BODY HAVING THROUGH OPENINGS

DESCRIPTION

The present invention relates generally to a structure for modifying energetic radiation, and more particularly to a structure for masking or shaping electron beam and X-rays, and to a method of making such a structure.

A structure according to the present invention may be used in the selective processing of workpieces with highly energetic radiation. The term highly energetic radiation refers in context particularly to ion beams, electron beams, and X-rays. The processing methods in which the above beams are used include e.g. ion implantation, ion etching, and ion beam, electron beam and X-ray lithography. These methods are of interest e.g. in the semiconductor field, and they are of ever growing interest owing to the increasing trend toward micor-miniaturization and higher density of the components in this technical field. Hereinafter, reference will mainly be made only to the use of these structures in electron beam lithography and X-ray lithography. This restriction is advisable since on the one hand the entire structure can be used particularly well in electron beam and X-ray lithography, and on the other hand the factors to be observed, and the difficulties to be surmounted are mostly typical for the other applications of the present invention. However, this restriction to electron beam and X-ray lithography does not mean that the structure according to the present invention cannot be used for the other purposes mentioned.

For making structures with elements whose dimensions are in the μm range and smaller by means of "photo"-lithographic methods, ultraviolet light for irradiation is no longer suitable since the necessary resolution cannot be achieved therewith. In order to achieve the necessary resolution, the radiation-sensitive resist is usually irradiated with electron or X-ray beams, the latter being even more advantageous than the electron beams with respect resolution.

The electron beam exposure devices used in electron beam lithography are divided into electron beam scanning systems and electron beam replication systems. In the electron beam scanning systems, an electron beam scans each point of a surface to be irradiated selectively, e.g., a radiation-sensitive resist layer on a workpiece, with the electron beam being switched off or blanked out via a computer control in those parts which are not to be irradiated, and thus generates the irradiation pattern wanted. In the electron beam replication systems, the surface to be selectively irradiated is irradiated through a mask which shows a pattern of through openings corresponding to the pattern to be generated.

An electron beam scanning system is described in the article "Variable Spot Shaping for Electron Beam Lithography" by H. C. Pfeiffer, in Journal of Vacuum Science Technology, 15(3), May/June 1978, page 887 ff. In this system, one (or two) square aperture(s) irradiated with an electron beam from an electron source is image demagnified on the substrate to be exposed, i.e. an electron beam with square cross-section impinges on the substrate. In the system described by Pfeiffer, the aperture dimensions are 500×500 μm. The square hole is worked out of a tantalum sheet through "electro-erosion". The quality of the hole is not very high which in this connection means that the hole edges are rough, that the hole corners are very rounded, and that the edges of the hole are not precisely orthogonal to each other.

Although the poor quality is of minor importance in those cases where, as in the less complicated systems, the aperature is generally imaged at a 200-fold demagnification on the substrate, a quality improvement of these apertures is urgently necessary if they are used in systems operating with a variable beam diameter. In these systems, the beam diameter can be adapted to the size of the respective pattern element to be irradiated so that it is possible to irradiate a surface much more quickly than in those cases where the beam has only a constant diameter adapted to the dimensions of the smallest pattern elements used. The demagnification factor for imaging the aperture on the substrate to be exposed is much smaller in systems operating with variable electron beam diameter than in those systems which operate with constant beam diameter. The smaller the aperture reduction in imaging, the greater the adverse consequences of its poor quality will be felt.

When an electron beam, to give an example, scans a surface of 10×10 mm$^2$ the beam diameter, if the other conditions remain constant, does not remain constant, too, i.e., the beam focus changes. Such a focusing change can be compensated through a control of the lens current during scanning (dynamic focusing). In order to measure the focus deviation from the nominal values in the individual areas of the surface to be irradiated, and to determine the necessary local change of the lens current, a so-called focusing grid is used. Conventional focusing grids of approximately 15×15 mm$^2$ consist of two systems of metal wires arranged as orthogonally to each other as possible. Focusing by means of this type of grid is described next.

The grid is first placed in a position where the surface to be irradiated is located, and is placed subsequently in the area of an intersection of two wires. The electron beam is first directed onto one wire, and then slowly moved away from that wire perpendicularly thereto. During this process, the beam intensity passing through the grid is registered point by point. This is repeated at the other wire, and the focusing at the intersection is obtained from the intensity values measured. The arrangement used heretofore shows considerable disadvantages which substantially consist in that the wires are not quite smooth, that the wires are not aligned exactly orthogonal to each other, that the intersecting wires are not in one and the same plane, in fact that in the beam direction they show a center spacing of 25 μm. Further, in the above-described focusing determination, owing to the locally very high thermal stress to which the wires are exposed, the wires move slightly and thus undesirably alter their position.

X-ray lithography for making integrated semiconductor circuits had been suggested for the first time in the early Seventies. Its main use will be in the production of submicron structures. Up to now, an essential disadvantage of conventional X-ray beam sources had been the uneconomically long irradiation times. Recently, there have been new developments in this field so that sufficiently intensive sources are now available. A still more important factor for X-ray lithography is the availability of thin film masks with maximum contrast to be defined hereinafter together with high mechanical stability.

Masks for X-ray lithography and their production are, e.g., described in an article by H. I. Smith et al., entitled, "Fabrication Procedure for Silicon Membrane X-ray Lithography Masks" in a publication by the Massachusetts Institute of Technology, Lincoln Laboratory, Technical Note 1973-38 dated September 20, 1973, and in a lecture entitled "High Transmission X-ray Masks for Lithographic Applications" by E. Bassous et al., delivered during the International Electron Device Meeting in Washington in December 1975. The X-ray masks described in these articles all consist of a structurized metallic layer which is to absorb the X-rays, and which is provided on a substrate membrane as thin as possible and consisting, e.g., of P+-silicon, polyimide, or a silicon dioxide layer and a silicon nitride layer. The production of the known masks is problematic, especially with respect to the structurization of the metallic layer. Two possible ways of structurizing the metallic layer are known:

1. Structurization by means of electroplating. This requires a metallic base layer which extends over the entire carrier membrane and thus deteriorates the contrast. Furthermore, electroplating is a wet chemical process. Its disadvantages cannot be evaded.
2. Structurization by means of ion etching. This is a dry etching process utilizing argon ions; material removal being effected exclusively on the basis of the kinetic energy of ions impinging on the metal. This method has considerable disadvantages when structures with narrow and deep grooves are to be etched since the photoresist covering the metallic layer areas not to be etched is removed at practically the same speed as the metal. If in order to avoid these problems the photoresist layer is made very thick (thicker than 1 $\mu$m), no pattern elements with submicron dimensions can be made even if the pattern in the photoresist layer is made by electron beams because of the scattering of the electrons. Furthermore, although vertical grooves can be etched by means of ion etching, the etched-off material is deposited on the groove walls and on the walls of the photoresist mask. The consequence of these depositions is that after the removal of the photoresist mask a metallic mask is obtained showing an interfering "seam" framing the pattern elements and protruding out of the mask plane. It is possible to substantially avoid this "seam" if during ion etching the metallic layer is tilted relative to the ion beam, and simultaneously rotated. However, the consequence of the latter action is further degradation of the groove depth to groove width ratio.

It is the object of the present invention to provide a structure used in particular as a mask in processes wherein highly energetic radiations are utilized, or as an aperture or focusing grid for such radiations. Such a structure is characterized by a high mechanical and thermal stability, by hole patterns with exactly defined dimensions and by a high contrast. It is also an object of the present invention to provide a method of making such a structure while maintaining very small manufacturing tolerances under mass-production conditions.

Independently of the type of beam used, contrast is defined as the ratio of intensity of the radiation after the passage through the through openings, and possibly through a mask substrate transparent for the radiation, to the intensity of the radiation after the passage through the metal silicide-covered silicon in the vicinity of the through openings, and possibly through the mask substrate.

The structure according to the invention combines the advantages of heavy metals as mask material with regard to their low transparency for highly energetic radiation and of silicon with regard to its high mechanical and thermal stability and its positive processing characteristics. Furthermore, the metal silicide is bonded to the silicon via chemical bonds so that the metal silicide layer does not separate from the silicon body even if the structure is partly or completely heated to a high temperature. For a specific radiation absorption in connection with a predetermined radiation energy the metal silicide layer can be made increasingly thin as a function of the rising atomic number of the metallic silicide component, and with an increasing silicide density.

A preferred embodiment in accordance with the present invention comprises a monocrystalline silicon wafer with (100)-orientation having at least one through opening which is parallel to the wafer surface has a square cross-section, and whose walls form with the wafer surface an angle of 54.7°, and that the metal silicide layer covers the lower and the upper surface of the silicon wafer, and the walls of the opening, or of the openings. If the preferred embodiment has one opening it is suitable as an aperture for imaging electron beams, and if it shows a regular matrix arrangement of openings it can be used as a focusing grid.

Problems typically encountered in heretofore known apertures and known focusing grids as a result of the inexact orthogonality and the poor quality of edges and corners do not appear in the structure according to the present invention due to the characteristics of the monocrystalline silicon and the excellent methods available for silicon processing. The quality of the edges of the openings or windows, and the precision with which the edges are perpendicular to each other exclusively depend only on the quality of the silicon monocrystal of which the silicon wafer has been made. Such quality of the silicon monocrystals is very high at present. Although in the described embodiment according to the invention the silicon thickness is rather thin owing to the inclined walls of the openings in the marginal zone of the window or of the windows, respectively, a thin, i.e., approximately 1 to approximately 1.5 $\mu$m thick, tungsten-silicide substrate applied on both sides will suffice fully to absorb the electrons.

When the structure is used as an aperture it is heated to a high temperature so that it absorbs approximately 90% of the primary electron beam (electron current approximately 1 $\mu$A). Heretofore conventional metal apertures are heated to 500° to 600° C. However, this does not raise a problem in the structure according to the invention whereas in tests made by the inventors of the present subject with an aperture made of silicon with a gold cover, the gold—owing to its different expansion coefficient and the moderate adhesion of gold to silicon, peeled off considerably. In the irradiation with electron beams, the focusing grids are heated to a high temperature locally. The beam with a diameter in the order of 1 $\mu$m has a current of approximately 5 $\mu$A. This does not present any problem, either, in the structure according to the invention while in tests made by the inventors of the subject of the application with focusing grids made of silicon coated with gold, the gold—owing to the high temperature gradient, the different expansion coefficients of silicon and gold, and the poor adhesion of gold on silicon—partly peeled off.

In the structure according to the invention there is no bending, either caused by heating, as observed in conventional focusing grids made of wire. Another advantage of the structure in accordance with the invention as compared with the known focusing grids made of wire consists in that the edges vertically placed one on the other are exactly within the same plane.

An embodiment of the structure in accordance with the invention suitable particularly as a mask for X-ray lithography is designed in such a manner that the monocrystalline silicon body having a (100)-orientation consists of a thin layer and of a supporting structure which partly supports this layer. The doping of the supporting structure differs from that of the layer, and that the layer in those areas where it is not supported by the supporting structure shows a through opening, or through openings. It is a particular advantage when the layer is P+-doped, and the doping of the supporting structure is low or non-existent, if the silicon body contains at least one tub-shaped recess whose side walls are formed by the supporting structure, and which side walls enclose with layer 11 an angle of 54.7°, and whose floor is made by the layer, and if the metal silicide layer covers the layer surface facing away from the supporting structure, and the walls of the opening or openings.

The hereinabove described mask does not permit the transfer of circular or closed-loop pattern elements; this is only possible when two corresponding complementary masks cooperate. However, if in the above embodiment of the structure according to the invention the silicon body is covered on one side with a layer transparent to X-rays, e.g. a silicon dioxide which also covers on one side the opening or openings, and if this layer is in turn covered with another layer equally trnsparent to X-rays, e.g. silicon nitride, a mask is obtained with which also circular and closed-loop pattern elements can be transferred. It is advantageous to provide a silicon dioxide as well as a silicon nitride layer since under the influence of a temperature increase a silicon nitride layer develops a tensile stress, and a silicon dioxide layer develops a compressive stress. These two kinds of stress cannot only be substantially compensated through the combination of the layers, but thin layers of silicon dioxide and silicon nitride already provide for the mask a very high stability, particularly in connection with high temperatures, which is considerably increased still further by the existence of the P+-doped silicon layer.

According to the above mentioned lecture by E. Bassous et al., superimposed thin layers of silicon dioxide and silicon nitride (overall thickness approximately 0.4 $\mu$m) have a higher transmission for X-rays than other substrates, as e.g. a several $\mu$m thick P+ silicon membrane, or an approximately 5 $\mu$m thick polyimide membrane. The relatively high transparency of P+-doped silicon for X-rays is overcompensated by the thin metal silicide layer provided on the P+-doped layer, and absorbing X-rays equally well as a layer of the corresponding metal.

The production of the structure according to the invention involves a great number of known process steps. The process is not only a succession of these process steps; in fact, the effected selection and combination of these process steps permits to produce a structure, in a surprisingly simple manner and by maintaining surprisingly small manufacturing tolerances, the properties of said structure being much more advantageous than those of the known structures used for the same purposes.

A structure that can, e.g. be used as an aperture or focusing grid is advantageously made as follows: on a monocrystalline silicon wafer with (100)—orientation polished on both sides, a silicon dioxide layer is thermally grown on both sides; into the one silicon dioxide layer, circular holes are etched following a predetermined pattern by means of reactive ion etching; using the etched silicon dioxide layer as an etching mask, the silicon in the silicon wafer is etched off down to the other silicon dioxide layer to make openings; the silicon dioxide layers are etched off, and finally, by means of two-sided vapor deposition, the silicon wafer is coated with a thin metallic layer, and subsequently annealed to produce the silicide layer. If one opening is etched into the silicon wafer, the finished structure can be used as an aperture; if a plurality of openings in matrix arrangement is made in the silicon wafer the finished structure can be employed as a focusing grid.

From the article "Fabrication of Novel Three-Dimensional Microstructures by the Anisotropic Etching of (100) and (110) Silicon" by E. Bassous in IEEE Transactions on Electron Devices, Vol. ED-25, No. 10, October 1978, pages 1178 ff., it is known to make tapering recesses with a square cross-section by means of anisotropic etching, in silicon wafers with (100)-orientation, using etch masks with circular openings However, it cannot be concluded from this publication that if the silicon dioxide etching mask is made by means of reactive ion etching this method permits making through openings with an exactly square form (i.e., with an edge length of 500 $\mu$m the lengths of vertically meeting edges may differ by less than 3 $\mu$m, and the orthogonality is excellent), and an edge quality, including where the edges meet, unattainable with any other method.

For making a structure suitable, e.g., as a mask for X-ray lithography, a preferred production method comprises the steps of: providing a monocrystalline silicon wafer with (100)-orientation polished on both sides and having at most a low doping is given a high doping on one side so that an approximately 1.5 to approximately 3 $\mu$m thick highly doped silicon layer is produced; on the silicon wafer surface facing away from the silicon layer a silicon dioxide layer having at least one opening is formed; using the silicon dioxide layer as an etching mask the silicon having at most a low doping is etched off selectively and anisotropically down to the silicon layer, with a supporting structure of low-doping areas of the silicon wafer being formed; the etching mask is removed; on the silicon layer surface facing away from the supporting structure a thin layer of a material, e.g., $SiO_2$, is grown which is transparent to X-rays, in whose presence silicon can be selectively removed by means of reactive ion etching, and which does not form a silicide with metal, and that thereon a layer of a material as, e.g., $Si_3N_4$, is grown which is transparent to X-rays and which with the layer beneath forms a mask substrate that is stable also under thermal stress; by means of reactive ion etching in the silicon dioxide layer not covered with silicon nitride a pattern of through holes corresponding to the desired pattern of through openings is produced; by means of reactive ion etching in an atmosphere containing argon and chlorine, using the pattern of through holes, through openings are made in the silicon layer, with the etching being discontinued after the boundary layer to the layer consisting, e.g., of silicon dioxide has been etched; after the removal of the silicon dioxide etching mask a thin layer of a metal, as e.g., tungsten which has preferably a high atomic order and forms a silicide of high density is vapor-deposited on the exposed silicon layer surface and on the surface of the layer, e.g., consisting of silicon dioxide exposed in the openings; annealing the metal layer for forming the silicide layer; and finally the non-reactant metal on the layer, e.g., consisting of silicon dioxide, is etched off.

Making a P+-doped silicon layer on the surface of a silicon wafer of low doping, or no doping at all with the purpose of ensuring during the selective thin etching of the silicon wafers that a thin layer of a defined thickness remains in the etched areas is known, e.g., from European patent application No. 78100294.4. Owing to the fact that in the method claimed here, contrary to the known methods of making masks for X-ray lithography, the mask pattern is made by means of reactive ion etching out of silicon that is of a relatively high transparency to X-rays, and that the absorption properties required for X-rays are generated only then through a subsequent "metallization" of the silicon. The disadvantages of the known method encountered with electroplating and ion etching are consequently avoided. The method described here permits in particular perfect edges of the pattern elements, and the ratio of groove depth to groove width can be high. The subsequent "metallization" of the mask pattern made is possible only because the metal does not react with the layer consisting, e.g., of $SiO_2$, and can therefore be removed after the silicide has formed without any problems and without the metal silicide having been affected.

The invention will be described with reference to embodiments illustrated by the accompanying drawings.

Figure 1:
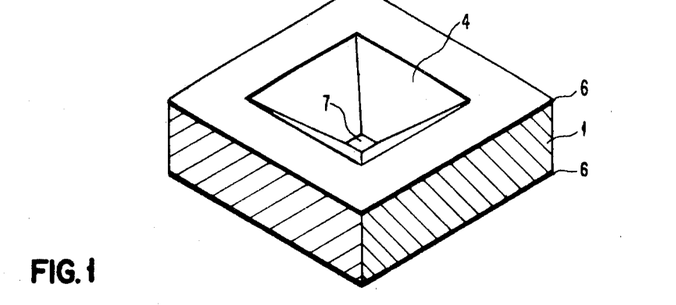
FIG. 1 in a perspective view a sector of an embodiment of the structure according to the invention suitable for producing a fixed cross-section of an electron beam, FIG. 2 in a perspective view a sector of another embodiment of the structure according to the invention suitable for the optimum focusing of an electron beam, FIG. 3 a cross-section through a sector of third embodiment of the structure according to the invention suitable as a mask for X-ray uses, FIGS. 4A to 4G in a cross-section sectors of the structures of FIGS. 1 and 2 in various stages of their production, and FIGS. 5A to 5G in a cross-section sectors of the structure of FIG. 3 in various stages of its production.

FIG. 1 is a perspective representation of a sector of a silicon wafer 1 with a thickness between approximately 100 and approximately 400 $\mu$m, preferably about 400 $\mu$m, showing a through opening 4. The upper and the lower surface of silicon wafer 1 have a (100)-orientation. Opening 4 has the form of a pyramid cut off in parallel to the base plate with a square ground plane and an angle of elevation of 54.7°. A square window 7 in the one surface of silicon body 1 which square window 7 determines the inside width of opening 4, and has edges perpendicular to each other which are very smooth. The corners formed by the perpendicular edges are sharp. The size of the window is approximately $500 \times 500$ $\mu m^2$. The critical factor is not the edge length but the length difference between perpendicular edges. In window 7 this difference is <3 $\mu$m. The surfaces of silicon wafer 1 including hole walls 4 consist of a $WSi_2$ layer 6 which is between approximately 1 and approximately 1.5 $\mu$m thick. Apart from tungsten, the metallic component of the silicide can be molybdenum, tantalum, rhenium, niobium, iridium, platinum and palladium. These metals have a high atomic number and form a silicide of high density.

The structure of FIG. 1, or window 7 in the structure can be used as an aperture in an electron beam irradiation device where a substrate is selectively irradiated without a mask being used.

Silicon is a very advantageous material when apertures are to be made with fixed dimensions within very small tolerances. However, its disadvantage is that it is of high transparency to highly energetic radiation, particularly if as in the rim zone of window 7 the layer thickness is relatively low. This problem is solved by metal silicide layer 6 which when its layer thickness is in the $\mu$m range already fully absorbs electron beams with an energy of approximately 25 keV. As the impinging radiation passes through window 7 undimmed, an aperture as described hereinabove and shown in FIG. 1 has a practically infinitely high contrast.

Figure 2:
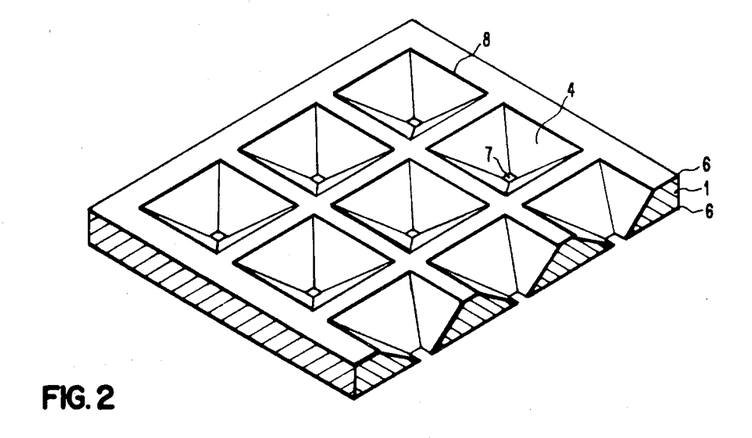

The structure of FIG. 2 is practically the same as that of FIG. 1. Its only difference is that it has not only one opening 4 but many openings in a regular matrix arrangement. The structure of FIG. 2 can be advantageously used as a focusing grid. The hole matrix in FIG. 2 has at least the size of that surface which is to be irradiated with an optimally focused beam. Typically, with a beam diameter in the order of 1 $\mu$m openings 4 have their biggest cross-section 8 between approximately 415 and approximately 450 $\mu$m, and an opening spacing of 100 $\mu$m, with silicon wafer $6 \leq 200$ $\mu$m and preferably between approximately 100 and approximately 150 $\mu$m thick. For measuring the focusing at openings 4, the electron beam is guided perpendicularly via two respective edges of window 7 that are perpendicular to each other, and the intensity and thus the intensity distribution in the beam is measured through windows 7.

Figure 3:
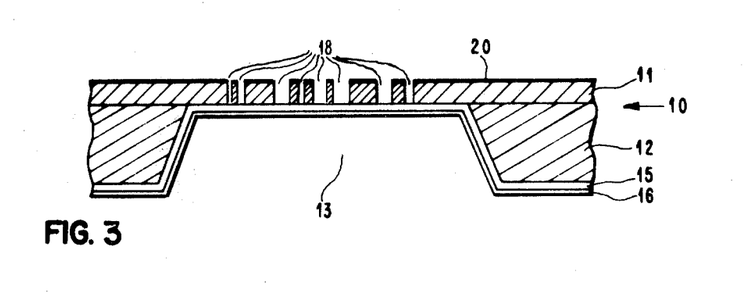

FIG. 3 shows in a cross-section a sector of a structure 10 not shown true to scale which can be used in particular as a mask for X-ray lithography. The structure 10 mainly consists of a structurized, monocrystalline silicon wafer with (100)-orientation, and having a through opening 13. The mask pattern consists of openings 18 through a layer 11 being approximately 1.5 to approximately 3 $\mu$m thick, and having walls substantially perpendicular to the mask surface. The smallest lateral dimensions of the pattern elements which are to be transferred with the mask, and in accordance to which openings 18 are to be dimensioned, are $\geq 0.2$ $\mu$m. In the areas without openings 18 (outside of the region corresponding to through hole 13) an approximately 250 $\mu$m thick supporting structure 12 is amplified by layer 11. Layer 11 differs from supporting structure 12 in its doping. To give an example, layer 11 can be P+-doped, and supporting structure 12 can be P-doped or N-doped. If layer 11 is boron-doped, the surface doping on the layer surface (i.e., on the side facing away from supporting structure 12) is $>10^{20}$ boron atoms/$cm^2$, and on the underside of the layer it is approximately $7 \times 10^{19}$ boron atoms/$cm^3$. Another possible doping combination is an N+-doping of supporting structure 12, and an N-doping of layer 11.

The self-supporting surface of layer 11 between columns of supporting structure 12 can easily be $5 \times 5$ cm, but if the mask is to be used for making structures in the submicron range, the maximum self-supporting surface should not be larger than approximately 4×4 cm². The side flanks of supporting structure 12 form with the mask surface an angle of 54.7°. Supporting structure 12 and the lower side of layer 11 are covered with an SiO₂ layer 15 of approximately 0.3 μm thickness, and thereon with an Si₃N₄ layer 16 approximately 0.1 μm thick, both also closing openings 18 on one side. Owing to the SiO₂-Si₃N₄ layer combination of high transparency to X-rays the mask pattern can also contain mask elements completely surrounded by openings 18. The upper side of layer 11 is covered by an approximately 1 to approximately 1.5 μm thick layer of a metal silicide 20 whose metallic component preferably consists of tungsten, but e.g., can also consist of molybdenum, tantalum, rhenium, niobium, iridium, platinum, or palladium. Basically, metals with a high atomic number able to form a silicide of high density are suited best as a silicon component. The silicide may also cover the walls of openings 18.

The mask described is characterized by high mechanical stability and a high contrast. With an X-ray wavelength between approximately 0.5 and approximately 5 nm, and an X-ray intensity of several 1000 mJ/cm² for the mask structure described, the contrast is approximately 8 to 10.

When the described mask structure is used for selectively irradiating a substrate with X-rays, the upper side of layer 11 faces the substrate to be exposed. If an irradiation from a conventional X-ray tube is used, a spacing ring ensures a spacing between mask and substrate of 20 μm maximum, whereas in the case of an irradiation coming from a synchrotron and thus consisting of a bundle of parallel beams the spacing between mask and substrate can be several tenths of millimeters.

In the following, production of the structure shown in FIGS. 1 and 2 according to the present invention will be described with reference to FIGS. 4A to 4G.

Figure 4A:
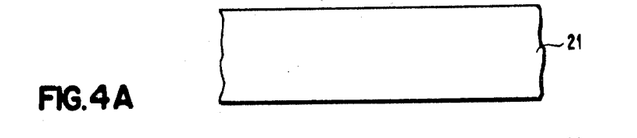
Figure 4B:
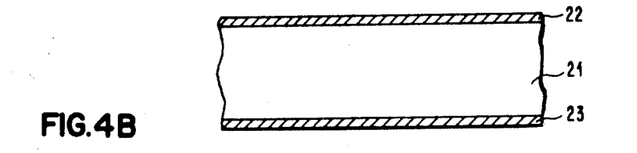

The process starts with a monocrystalline silicon wafer 21 with (100)-orientation polished on both sides (see FIG. 4A). The lower the surface roughness of silicon wafer 21, the more precise the edges of the window etched in a later process step, which windows correspond to windows 7 in FIGS. 1 and 2. When the structure to be made is used as a focussing grid, the thickness of silicon wafer 21 is ≦200 μm, and preferably between 100 and 150 μm approximately, and if the structure will be used as an aperture it is between approximately 100 and approximately 400 μm, and preferably approximately 400 μm. On the lower and the upper side of silicon wafer 21, one respective silicon dioxide layer 22 and 23 of approximately 1 μm thickness is applied either by thermal oxidation or by cathode sputtering (see FIG. 4B).

Figure 4C:
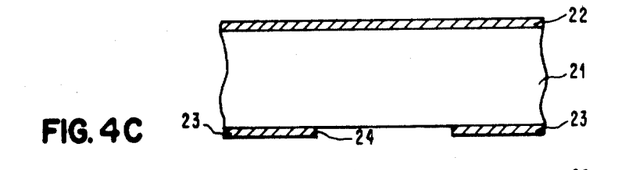

At least one circular opening 24 is etched in the lower side of SiO₂ layer 23. As specified in the above mentioned article by E. Bassous in IEEE Transactions on Electron Devices, the advantage of an etching mask with circular windows is that in a subsequent anisotropic wet etching the SiO₂ edge quality in opening 24, at the four points where the four lines of intersection between the (100)- and the (111)-planes contact the mask edges, influences the quality of the windows to be made, i.e., defects in the SiO₂ mask edge are of influence only where the four lines of intersection contact the mask edge in opening 24. Unlike prior art, openings 24 are etched out of SiO₂ layer 23 by means of reactive ion etching, using a photo-resist mask made e.g., of the positive resist marketed by Shipley under the trade name AZ 1350J. There, the exposed areas of SiO₂ layer 23 are removed by means of a glow discharge in a CF₄ and H₂ containing atmosphere. Preferred conditions are: quantity ratio CF₄:H₂ approximately 60:40, HF power density 0.2 Watt/cm², overall pressure 2.6 μbar, gas flow 20 ccm/min. The result of this process step is shown in FIG. 4C.

Figure 4D:
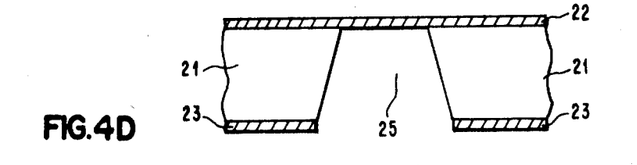

The areas of silicon wafer 21 exposed in openings 24 are now removed by an anisotropically acting etchant. Anisotropically means that the (100)—planes are etched much more quickly than the (111)-planes. Suitable etchants are an aqueous solution of KOH etching the (100)-planes up to 400 times quicker than the (111)-planes, and a mixture of ethylene diamine, pyrocatechol, and water etching the (100)-planes 20 to 40 times quicker than the (111)-planes. An advantageous solution contains 50% KOH, by weight, and is used at a temperature of 50° C. An advantageous mixture contains 35 ml ethylene diamine 4 g pyrocatechol and 8 ml water, and it is used at 180° C. The walls of openings 25 formed during etching include with the (100)-planes an angle of 54.7°. For making in the upper side of silicon wafer 21 a window of predetermined dimensions which corresponds to window 7 in FIGS. 1 and 2, the diameter of opening 24 has to be determined in consideration of this angle, and of the thickness of silicon wafer 21, and of the various speeds with which (100) and and (111) planes are etched. The structure resulting after etching is shown in FIG. 4D. Finally, silicon dioxide layers 22 and 23 are removed giving rise to the resulting structure having window 26 shown in FIG. 4E.

Figure 4E:
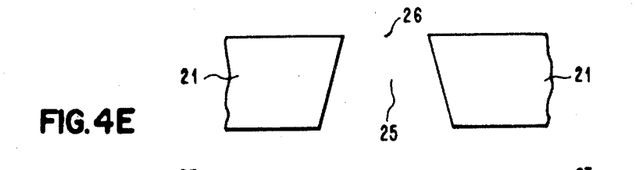
Figure 4F:
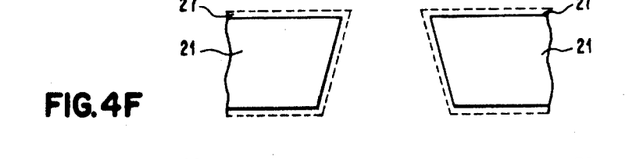

The structure of FIG. 4E is subsequently coated with a metal silicide layer. As a metallic component of the silicide, tungsten is preferably used. However, a number of other heavy metals of high atomic number can be used as metallic silicide components, as e.g., molybdenum, tantalum, rhenium, niobium, iridium, platinum or palladium, which can form a silicide and whose silicide is of high density. A method of making the silicide consists of vapor depositing a thin layer 27 typically 0.5 μm thick (see FIG. 4F) of a metal (e.g., tungsten) on the surface of silicon wafer 21 and on its lower side and on the walls of opening 25, with silicon wafer 21 having a temperature of approximately 150° C. There follows an annealing process at 1000° C. in an inert gas atmosphere until the silicide (see layer 28 in FIG. 4G) has quantitatively formed out of the metal and silicon on the surface of silicon wafer 21. Converting a 0.3 μm thick tungsten layer into tungsten silicide requires an annealing period of approximately 30 minutes. The conversion of thicker tungsten layers takes longer accordingly.

For silicide formation, it is also possible to vapor-deposit on both sides of silicon wafer 21 heated to 150° C. first a thin silicon layer and subsequently the metal (e.g., tungsten, and silicon) in the approximately correct atomic ratio required for silicide formation. Subsequently, annealing may be performed as specified above. Small deviations from the correct atomic ratio required for silicide formation are compensated through the absorption of silicon from the silicon substrate, or the transfer of silicon to said substrate.

Figure 4G:
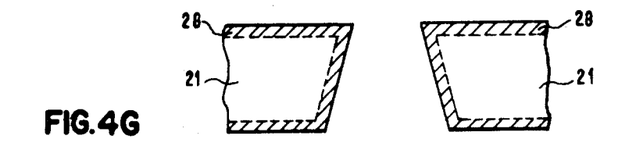

Silicide layer 28 which is chemically bonded to silicon wafer 21 shows an excellent "adhesion". Silicide layer 28 which, if it consists of WSi₂ and if its production was started with an approximately 0.5 μm thick tungsten layer 26, has a thickness of approximately 1 to 1.5 μm. This thickness suffices completely to absorb electrons with an energy of approximately 25 keV.

With reference to FIGS. 5A to 5G, production of the structure in FIG. 3 according to the present invention will be described next.

Figure 5A:
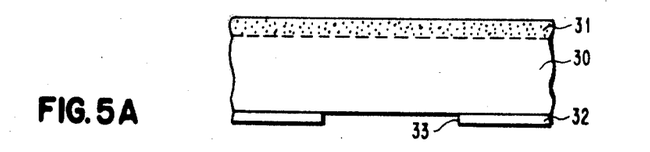

The process starts with a monocrystalline silicon wafer 30 of low doping or no doping at all, with (100)-orientation, and which typically has a thickness of approximately 250 μm but can also be between 100 and 400 μm thick approximately. The one surface of silicon wafer 30 (hereinafter referred to as the back) is coated with a 0.5 to 1 μm thick silicon dioxide layer 32, e.g., by thermal oxidation. Subsequently, the surface facing away from the back (hereinafter referred to as the front) of silicon wafer 30 is highly doped with an impurity giving rise to a P+ conductivity, so that layer 31 is formed. An advantageous impurity is boron. The boron doping on the silicon surface is typically at $>10^{20}$ atoms/cm$^3$ and, in a depth between approximately 1.5 and approximately 3 μm, at $7 \times 10^{19}$ atoms/cm$^3$. At least one opening 33 is then made in silicon dioxide layer 32. The lateral dimensions of the opening, or of openings 33 are determined by the desired lateral dimensions of the tub-shaped recesses to be etched into silicon wafer 30 in the next process step.

Figure 5B:
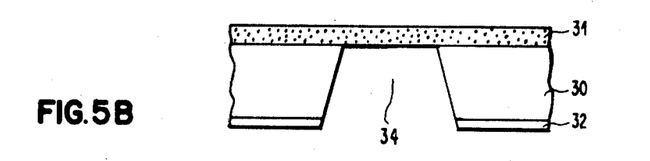

Using silicon dioxide layer 32 as an etching mask, silicon wafer 30 is subjected to thin etching from the back. For etching, the above mentioned mixture of ethylene diamine, pyrocatechol, and water under the conditions mentioned is preferred. The etching process in the direction vertical to the wafer surface is stopped almost completely when such an amount of material has been removed that the etching solution contacts the back P+-doped layer 31 where its impurity concentration is $\geq 7 \times 10^{19}$ atoms/cm$^3$. FIG. 5B shows partly in a cross-section the thus obtained structure having at least one recess 34. The structure has at least one silicon membrane which is an area of P+-doped layer 31 which according to the conditions of boron doping is approximately between 1.5 and approximately 3 μm thick. Layer 31 is under a moderate tensile stress, and owing to its monocrystalline character has an excellent mechanical stability so that its dimensions may easily be $5 \times 5$ cm$^2$. However, if the structure to be made is to be used in the production of structures with elements in the submicron range, the dimensions of layer 31 should not be larger than approximately $4 \times 4$ cm$^2$. The side flanks of the remaining, low-doped areas of silicon wafer 30 which serve as supporting structure for layer 31 form with the wafer surface an angle of 54.7°.

Figure 5C:
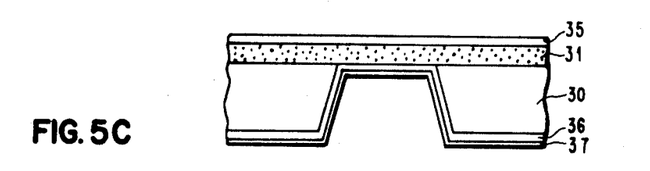

Subsequently, silicon dioxide layer 32 is removed. Then, on the front of layer 31, a 0.8 μm thick silicon dioxide layer 35, and on the back of layer 31 and on supporting structure 30 an approximately 0.3 μm thick silicon dioxide layer 36, and on the latter an approximately 0.1 μm thick silicon nitride layer 37 are applied. FIG. 5C shows in a cross-section parts of the thus obtained structure. The application of silicon dioxide layers 35 and 36 is effected e.g., by means of cathode sputtering, or by means of chemical vapor deposition at temperatures of less than 600° C. Silicon nitride layer 37 is e.g., made by means of chemical vapor deposition at temperatures of less than 600° C.

For better illustration of the details which are of interest in the following process steps, FIGS. 5D to 5G, unlike FIGS. 5A to 5D representing cross-sections through the entire thickness of the semiconductor wafer, show enlarged sections of the front area of the structure to be made.

Figure 5D:
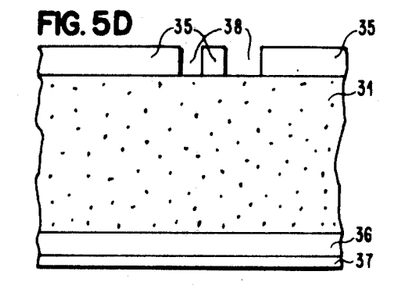
Figure 5E:
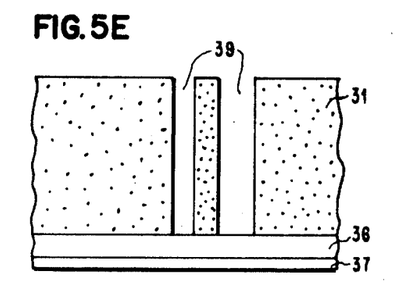
Figure 5F:
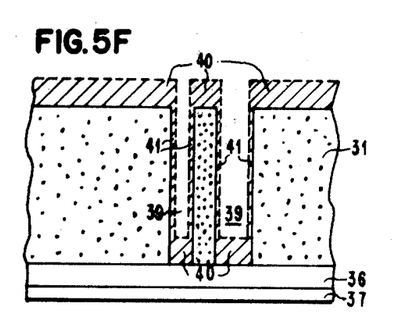
Figure 5G:
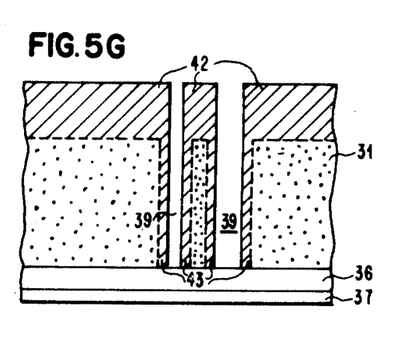

In SiO$_2$ layer 35 on the front of layer 31, a pattern of openings 38 is made by means of a lithographic etching process. The necessary mask may be structured of an electron-sensitive resist, preferably by means of an electron beam pattern generator, and the etching of the silicon dioxide being preferably effected by means of reactive ion etching in a glow discharge. Reactive ion etching is preferably carried out within a diode system in an atmosphere containing CF$_4$ and H$_2$ (preferably in a quantity ratio of 60 to 40) with an overall pressure of approximately 2.66 μbar at a total gas flow of 20 standard-cm$^3$/min. and an HF power density of approximately 0.2 watt/cm$^2$. FIG. 5D shows part of the structure at this stage in a cross-section. Openings 38 in SiO$_2$ layer 35 exist only over those areas of layer 31 which form a silicon membrane.

Using the pattern of openings 38 in silicon dioxide layer 35, through holes 39 are etched in layer 31 down to silicon dioxide layer 36 by means of reactive ion etching in a glow discharge. Preferably, the etching process takes place in a diode system in an atmosphere consisting of argon and chlorine (preferably in a quantity ratio of 90:10), with an overall pressure of 2.66 μbar and a power density of 0.2 Watt/cm$^2$. With these conditions, the ratio of the speeds with which SiO$_2$ and Si are etched is 1:10, i.e., P+ silicon is etched approximately 10 times as quick as silicon dioxide. It is thus easily possible to etch lines of 0.5 μm width 4 μm deep into the silicon provided an approximately 0.8 μm thick SiO$_2$ etching mask is used at the beginning. The 1:10 ratio of the etching speeds is advantageous also because etching is practically stopped at silicon dioxide layer 36. Parts of the structure obtained after etching and the removal of silicon dioxide layer 35 is shown in a cross-section in FIG. 5E.

A metal silicide layer is now produced on the front of layer 31. This is effected as in the production of the metal silicide layer described above in connection with FIGS. 4F and 4G. The only differences compared with the above described method consist in that in the present case only the front of layer 31 is vapor deposited with a metal, and the second possibility, i.e., the simultaneous vapor deposition of the metal and of the silicon from two sources is not applicable here. The above mentioned suitable metals are highly advantageous for silicide formation, too, since they all have a high atomic number advantageous for an absorption of the x-rays, and since they form a silicide of high density. Parts of the structure obtained after the vapor deposition of a metallic layer 40 or 41 (e.g., of tungsten) is shown in a cross-section in FIG. 5F. It is evident that the metal had been deposited not only on the top of silicon layer 31 but also on silicon dioxide layer 36 in openings 39 (metallic layer 40) and, although with a lower layer thickness, on the walls of openings 39 (metallic layer 41). The thickness of metallic layer 40 is determined in accordance with the contrast desired.

There follows an annealing process as described above. The metal, as e.g., tungsten, which is in contact with silicon reacts forming a metal silicide layer 42 or 43, respectively of stoichiometric composition, e.g., a layer consisting of WSi$_2$. After the forming of metal silicide layers 42 and 43 on silicon layer 31 the metal on the SiO$_2$ still exist unchanged, and can thus easily be etched off selectively by a wet chemical process. Parts of the structure after the forming of metal silicide layers 42 and 43, and after the etching off of the metal on silicon dioxide layer 36 is shown in a cross-section by FIG. 5G. As stated above, the vapor deposition of metal comprises also the deposition of metal on the walls of openings 39, and consequently the annealing process includes the forming of metal silicide layer 43 on the walls of openings 39. This is actually not one of the aims of the invention, particularly because it might effect a change of the cross-section of openings 39 in parallel to the surface of silicon layer 31. However, the silicide formation on the walls of openings 39 is not critical. It can be made sure in the first place by means of correspondingly fixing vapor deposition conditions that only a very small amount of metal is deposited on the walls of opening 39. In those cases where the still appearing change of dimensions is remarkable either some tenths of μm of Si can be etched off isotropically prior to the vapor deposition of the metal in a dry etching process, e.g., with $XeF_2$, or the reduction of the pattern size caused by the silicide formation can be compensated by correspondingly larger holes 38 in silicon dioxide mask 35.

We claim:

1. A structure for modifying energetic radiation comprising a silicon body having a through hole defining a passage for said energetic radiation; and a layer of heavy metal silicide covering the surface of said silicon body, whereby said metal silicide layer maintains good adherence to said silicon body under thermal stress, and said metal silicide layer absorbs said energetic radiation except in said defined passage by way of said through hole.

2. A structure for masking energetic radiation comprising:
   a silicon body having a through hole defining a passage for said energetic radiation by way of said through hole; and
   a layer of heavy metal silicide covering the surface of said silicon body;
   whereby said metal silicide layer maintains good adherence to said silicon body under thermal stress, and said metal silicide layer absorbs said energetic radiation except in said defined passage by way of said through hole.

3. A structure as set forth in claim 2 wherein said silicon body has an array of through holes; said structure is exposed to, and serves as a focusing grid for said energetic radiation.

4. A structure for masking energetic radiation as set forth in claim 2 wherein the metallic component of said layer of metal silicide has a high atomic number, and the metal silicide is of a high density.

5. A structure for masking energetic radiation as set forth in claim 2 wherein the metallic component of said metal silicide is selected from the group consisting of tungsten, molybdenum, tantalum, rhenium, niobium, eridium, platinum and palladium.

6. A structure for masking energetic radiation as set forth in claim 2 wherein said silicon body is a monocrystalline silicon wafer with (100) orientation.

7. A structure for masking energetic radiation as set forth in claim 6 wherein said through hole of said silicon body includes a square cross-section parallel to the surface of said silicon wafer, each of the sidewalls of said through hole forms an angle of approximately 54.7° with the surface of said silicon wafer; and said metal silicide layer covers the upper surface, and the lower surface of said silicon wafer, and the sidewalls of said through hole.

8. A structure as set forth in claim 7 wherein said silicon body has an array of through holes; said structure is exposed to, and serves as a focusing grid for said energetic radiation.

9. A structure for masking energetic radiation comprising:
   a silicon body having a tub-shaped through opening;
   a thin layer being supported by one surface of said silicon body, said thin layer having a through hole within the region of said tub-shaped through opening of said silicon body and defining a passage for said energetic radiation by way of said through hole; and
   a heavy silicide layer covering said thin layers;
   whereby said metal silicide layer maintains good adherence to said silicon body under thermal stress, and said metal silicide layer absorbs said energetic radiation except in said defined passage by way of said through hole.

10. A structure as set forth in claim 9 wherein said thin layer is heavily doped, and said silicon body has a relatively low doping, each of the sidewalls of said tub-shaped through opening forms with the surface of said thin layer an angle of approximately 54.7°, and said silicide layer covers both said thin layer and the sidewalls of said through hole.

11. A structure as set forth in claim 10 wherein a first layer transparent to X-rays is formed on the opposite surface of said silicon body covering also said through opening and said through hole.

12. A structure as set forth in claim 11 wherein a second layer transparent to X-ray is formed covering said first layer.

13. A structure as set forth in claim 12 wherein said first layer is silicon dioxide and said second layer is silicon nitride.

* * * * *